(12) United States Patent
Lin

(10) Patent No.: US 9,978,829 B2
(45) Date of Patent: *May 22, 2018

(54) LOW IMPEDANCE HIGH DENSITY DEEP TRENCH CAPACITOR

(71) Applicant: Taiwan Semiconductor Manufacturing Co., Ltd., Hsin-Chu (TW)

(72) Inventor: Jyun-Ying Lin, Wujie Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/867,723

(22) Filed: Sep. 28, 2015

(65) Prior Publication Data

US 2016/0020267 A1    Jan. 21, 2016

Related U.S. Application Data

(63) Continuation-in-part of application No. 13/685,029, filed on Nov. 26, 2012, now Pat. No. 9,178,080.

(51) Int. Cl.
   *H01L 21/02*    (2006.01)
   *H01L 49/02*    (2006.01)
   *H01L 29/94*    (2006.01)

(52) U.S. Cl.
   CPC ............ *H01L 28/91* (2013.01); *H01L 29/945* (2013.01)

(58) Field of Classification Search
   CPC ... H01L 27/10894; H01L 28/91; H01L 21/84; H01L 21/845; H01L 27/0248;
   (Continued)

(56) References Cited

U.S. PATENT DOCUMENTS 3,976,922 A    8/1976 Peck et al.
6,731,493 B2   5/2004 Zhong et al.
(Continued)

OTHER PUBLICATIONS

U.S. Appl. No. 13/685,029, filed Dec. 26, 2012.
(Continued)

*Primary Examiner* — Meiya Li
(74) *Attorney, Agent, or Firm* — Eschweiler & Potashnik, LLC

(57) ABSTRACT

Some embodiments relate to high density capacitor structures. Some embodiments include a first trench capacitor, a second trench capacitor and an interconnect structure. The first trench capacitor includes a first capacitor plate disposed in a plurality of trenches in a semiconductor substrate, and a second capacitor plate disposed in the plurality of trenches and separated from the first capacitor plate by a first capacitor dielectric along bottom and sidewall surfaces of the plurality of trenches. The second trench capacitor is disposed over the first trench capacitor. The second trench capacitor includes the second capacitor plate, and a third capacitor plate disposed in the plurality of trenches and separated from the second capacitor plate by a second capacitor dielectric. The interconnect structure connects the first capacitor plate and the third capacitor plate such that the first and second trench capacitors are in parallel.

20 Claims, 18 Drawing Sheets

(58) Field of Classification Search
CPC ............ H01L 27/0255; H01L 27/0629; H01L 27/1052; H01L 27/10826; H01L 27/1085; H01L 27/10852; H01L 27/1087; H01L 27/10873
See application file for complete search history.

(56) References Cited

U.S. PATENT DOCUMENTS

| | | |
|---|---|---|
| 6,936,877 B2 | 8/2005 | Klee et al. |
| 9,178,080 B2 * | 11/2015 | Kalnitsky ............ H01L 29/945 |
| 2001/0025973 A1 | 10/2001 | Yamada et al. |
| 2003/0008469 A1 | 1/2003 | Hwang et al. |
| 2008/0185626 A1 | 8/2008 | Cheng |
| 2013/0161792 A1 | 6/2013 | Tran et al. |
| 2014/0145299 A1 | 5/2014 | Kalnitsky et al. |

OTHER PUBLICATIONS

Non-Final Office Action dated Jul. 3, 2014 for U.S. Appl. No. 13/685,029.
Final Office Action dated Nov. 17, 2014 for U.S. Appl. No. 13/685,029.
Notice of Allowance dated Jul. 2, 2015 for U.S. Appl. No. 13/685,029.

* cited by examiner

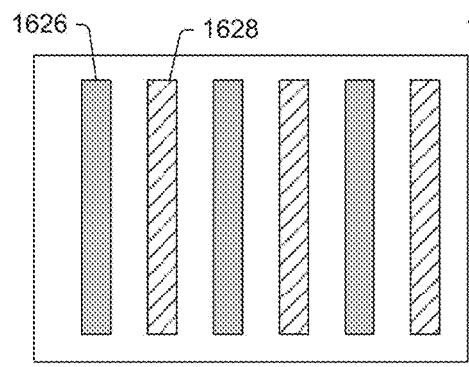
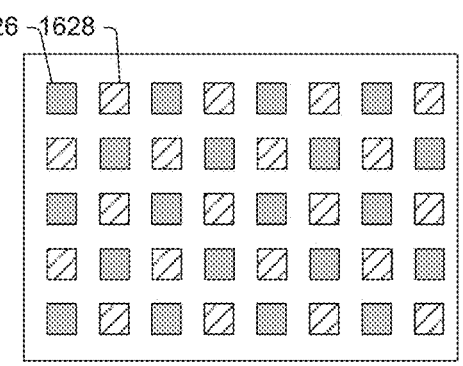
FIG. 16C  FIG. 16D
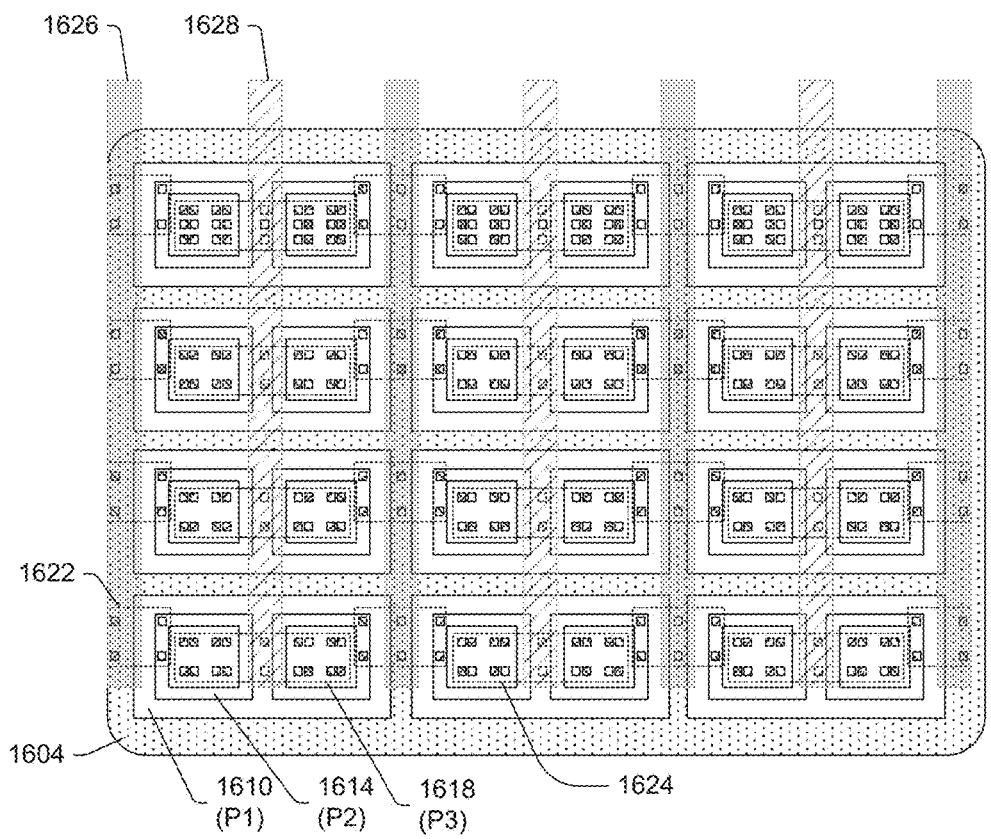
FIG. 16E

LOW IMPEDANCE HIGH DENSITY DEEP TRENCH CAPACITOR

REFERENCE TO RELATED APPLICATION

This Application is a Continuation-In-Part of U.S. application Ser. No. 13/685,029 filed on Nov. 26, 2012, the contents of which are incorporated by reference in their entirety.

BACKGROUND

Capacitors are used for a myriad of purposes on modern integrated circuits. For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high density capacitor in either the IC technology of interest or in a stand-alone process that results in an integrated capacitor device easily mountable on the IC.

BRIEF DESCRIPTION OF THE DRAWINGS

FIG. 16C and FIG. 16D show top views of bonding pads of FIG. 16A's high density capacitor in accordance with some embodiments.

FIG. 16E shows a top view of FIG. 16A's high density capacitor in accordance with some embodiments.

DETAILED DESCRIPTION

Figure 1A:
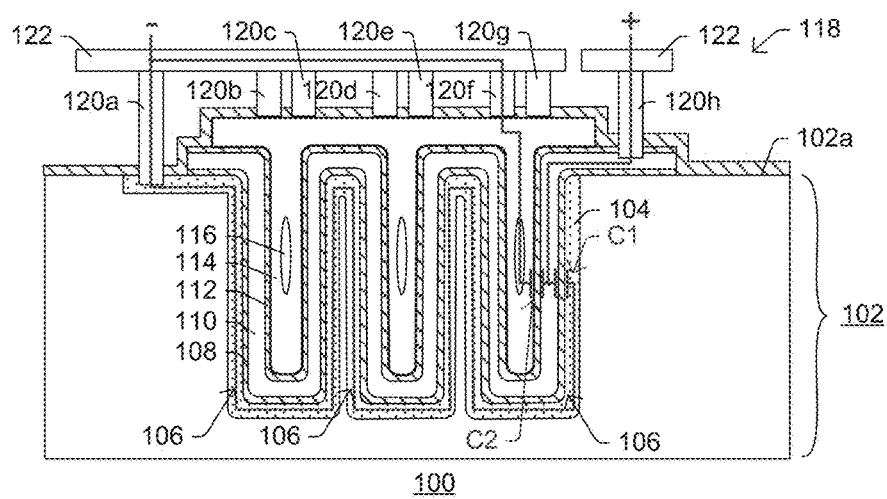
FIG. 1A shows a cross-sectional view illustrating some embodiments of an integrated circuit having a high density capacitor formed thereon.

One or more implementations of the present invention will now be described with reference to the attached drawings, wherein like reference numerals are used to refer to like elements throughout. The drawings are not drawn to scale.

As will be appreciated further herein, the present disclosure relates to improved techniques for high-density capacitors, which are formed in an integrated circuit process or in a stand-alone technology for subsequent wafer level or chip level interconnect between an IC and a capacitor chip. In these high density capacitors, two or more deep trench capacitors are "stacked" over one another and are coupled in parallel to increase capacitance density, relative to conventional implementations. Although several examples are illustrated and described below, these examples do not in any way limit the scope of the present disclosure. A two capacitor stack formation is shown for clarity and simplicity of the illustration.

FIG. 1A shows a cross-sectional view of a high density capacitor 100 formed on an integrated circuit (IC) in accordance with some embodiments. The capacitor 100 is formed on a semiconductor substrate 102, which is often a silicon wafer having a first conductivity type (e.g., n−). A highly doped conductive region 104, which often has a second conductivity type (e.g., p++) is formed within the substrate 102, and a number of trenches 106 extend downward from a substrate upper surface 102a into the conductive region 104. Alternatively, if the only required component of this integrated circuit is a capacitor that does not require capacitor to capacitor isolation (i.e., one plate of all capacitors can operate at the same potential), a heavily doped P++ or N++ wafer can be used to reduce the cost associated with the formation of the conductive region 104. A first dielectric layer 108 is formed in the respective trenches 106 and a first conductive layer 110 (e.g., a first polysilicon layer) is formed over the first dielectric layer 108. A second dielectric layer 112 is formed in the trenches 106 and over the first conductive layer 110, and a second conductive layer 114 is formed in the trenches 106 and over the second dielectric layer 112. Due to the high aspect ratio of the trenches 106, the second conductive layer 114 often includes gaps or voids 116 in the respective trenches.

An interconnect structure 118, which includes contacts (e.g., 120a-120h) and a metal1 layer 122 in the illustrated example, couples the conductive region 104 to the second conductive layer 114. In this way, the interconnect structure 118 couples a first capacitor, C1 (which has conductive plates 104, 110 separated by the first dielectric layer 108), in parallel with a second capacitor, C2 (which has conductive plates 110, 114 separated by the second dielectric layer 112). Thus, FIG. 1A's high density capacitor 100 includes two capacitors C1, C2, which are "stacked" over one another and which are coupled in parallel to increase the capacitance density, relative to conventional implementations. See also FIG. 1B (illustrating an equivalent circuit for FIG. 1A's capacitor.)

Figure 1B:
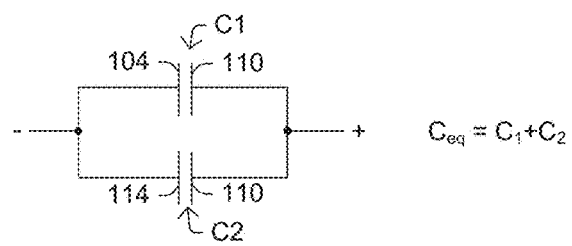
FIG. 1B shows an approximate equivalent circuit schematic corresponding to the high density capacitor of FIG. 1A.
Figure 1C:
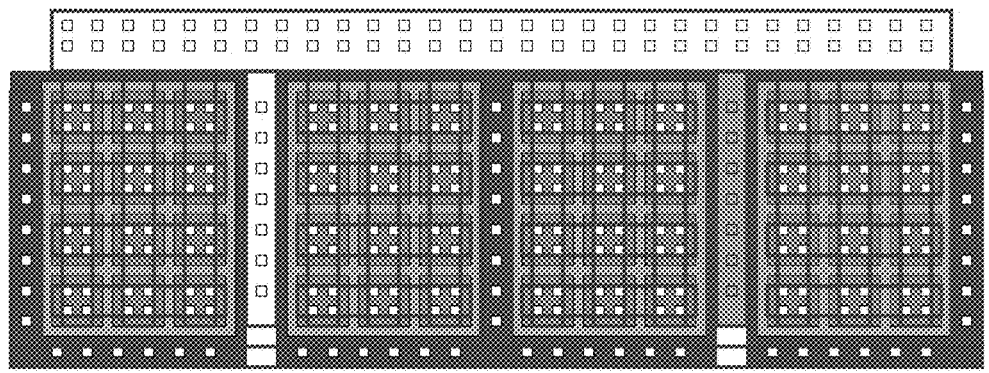
FIG. 1C shows a top view illustrating some embodiments of an integrated circuit having a high density capacitor formed thereon, corresponding to FIG. 1A.

FIG. 1C shows a top view of the capacitor 100, wherein the trenches underlying the capacitors are arranged in an array 150 of rows and columns, and wherein a single capacitor spans multiple rows and columns.

In FIGS. 1A-1C, the capacitance of each of the first and second capacitors C1, C2 is defined as:

$$C_i = \varepsilon_{ri}\varepsilon_0 \frac{A_i}{d_i}$$

Where i=1 for the first capacitor, and i=2 for the second capacitor; $A_i$ is the area of overlap of the conductive capacitor plates for the respective capacitors; $\varepsilon_{ri}$ is the relative static permittivity of the material between the plates for the respective capacitors; $\varepsilon_0$ is the electric constant ($\varepsilon_0 \approx 8.854 \times 10^{-12}$ F m$^{-1}$); and $d_i$ is the distance separating the conductive capacitor plates for the respective capacitors.

In FIG. 1A's embodiment, the geometry due to ridges or pillars defined between neighboring trenches 106 provides an increased amount of area ($A_i$) for the first and second capacitors C1, C2 (relative to planar capacitors or capacitors with only a single trench), which tends to provide an increased capacitance. Further, using relatively thin first and second dielectric layers 108, 112 tends to reduce $d_i$, which also tends to increase the capacitance. Lastly, the fact that the interconnect structure 1108 couples the first capacitor $C_1$ in parallel with the second capacitor $C_2$ also increases the effective capacitance of the capacitor 100. This is because the capacitances of capacitors arranged in parallel add together (e.g., $C_{eq} = C_1 + C_2$). Because of these factors, FIG. 1A's structure offers a high density capacitor layout, relative to conventional solutions.

Figure 2:
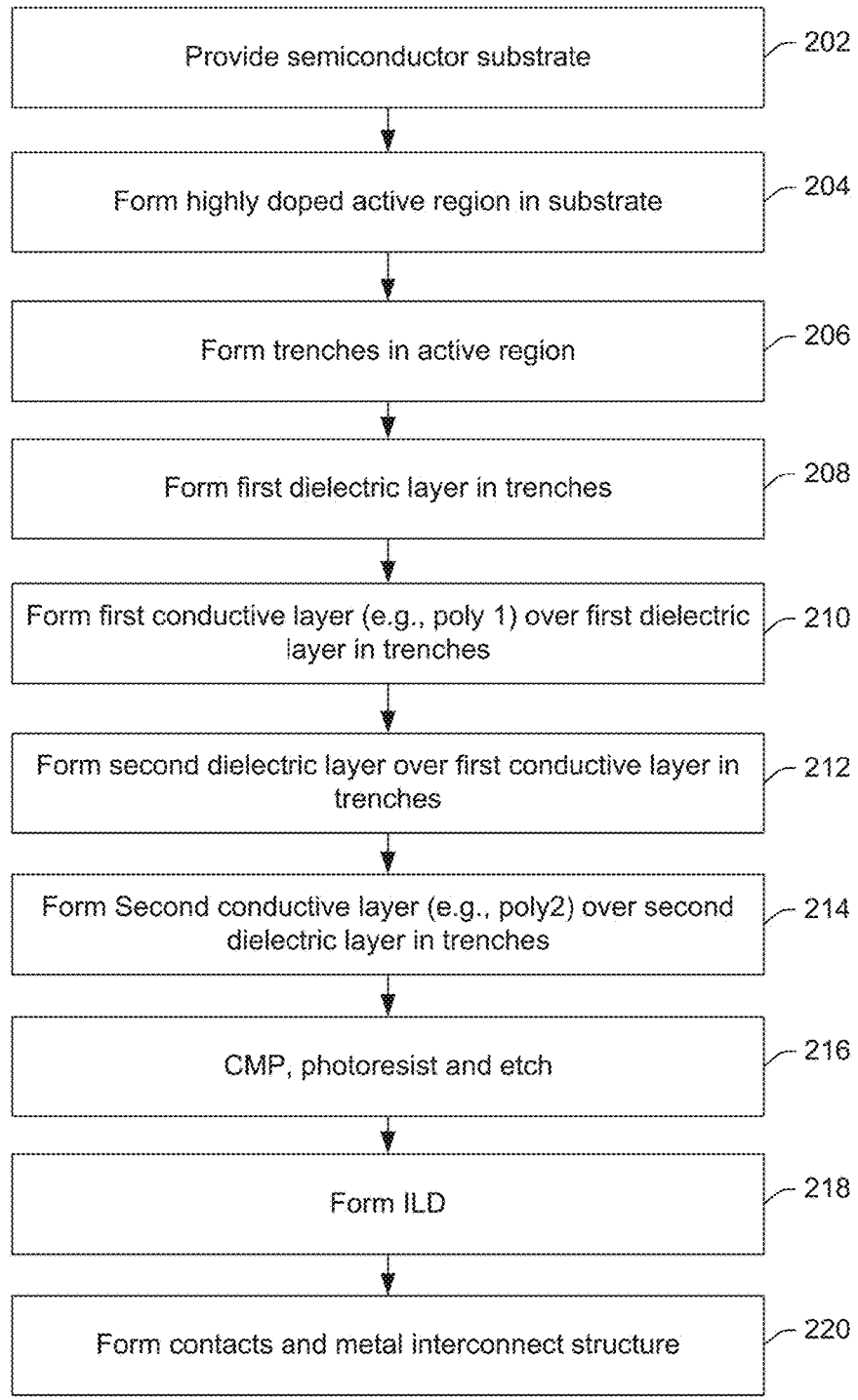
FIG. 2 is a flow-chart illustrating some embodiments of a methodology for manufacturing a high density capacitor.

FIG. 2 is a flow-chart illustrating an example method for manufacturing FIG. 1's capacitor, while FIGS. 3-11 (discussed further herein) show a series of cross-sectional views that collectively illustrate an example method for manufacturing FIG. 1's capacitor. These manufacturing methods are now described below. It will be appreciated that, for purposes of simplicity and readability, some steps may be omitted from what is illustrated and described below, and that other steps may be used in addition to (or in place of) those illustrated and described below.

FIG. 2's method 200 starts at 202, where a semiconductor substrate is provided. In 204, a highly doped conductive region is formed in the substrate. The highly doped conductive region will act as a lower capacitor plate for a first capacitive element. In 206, a number of trenches are formed in the conductive region. (Note that in alternative embodiments blocks 204 and 206 are transposed with one another.) In 208, a first dielectric layer, which will act as a dielectric for the first capacitive element, is formed. In 210, a first conductive layer, such as a poly1 layer for example, is formed over the first dielectric layer in the trenches. In 212, a second conductive layer is formed over the second dielectric layer in the trenches. In 214, a second conductive layer, such as a poly2 layer, is formed in the trenches. In 216, chemical mechanical polishing (CMP) is carried out, photoresist mask (and/or other mask) is provided over the planarized workpiece and is patterned, and an etch is carried out with the mask in place. In 218, an inter-level dielectric is formed, after which contacts and metal interconnect are formed in 220. In this way, the method 200 forms first and second trench capacitors that are stacked on top of one another and arranged in parallel with one another.

Figure 3:
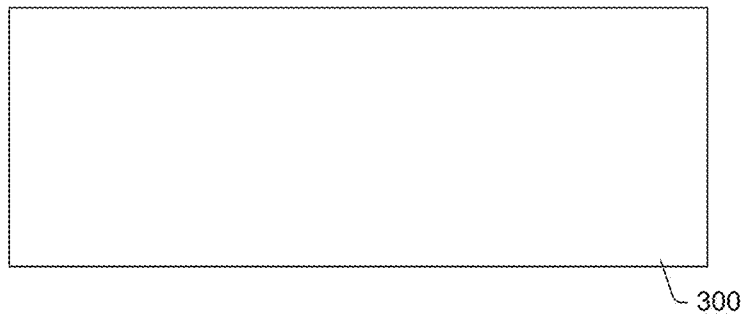
FIGS. 3-11 are a series of cross-sectional views that collectively illustrate some embodiments of a methodology for manufacturing a high density capacitor.

FIGS. 3-11 show other embodiments for methods of manufacturing a high density capacitor. The method starts with reference to FIG. 3, where a semiconductor substrate 300 is provided. In FIG. 3's illustrated embodiment, the substrate 300 can be a bulk semiconductor wafer having a first conductivity type at a first doping concentration. For example, substrate can be a silicon wafer that is lightly doped with a p-type dopant, or can be heavily doped with a p-type dopant. The substrate can be implemented as a bulk silicon wafer substrate, a binary compound substrate (e.g., GaAs wafer), a ternary compound substrate (e.g., AlGaAs), or higher order compound wafers, among others. Further, the semiconductor substrate 202 can also include non semiconductor materials such as oxide in silicon-on-insulator (SOI), partial SOI substrate, polysilicon, amorphous silicon, or organic materials, among others. In some embodiments, the semiconductor substrate 202 can include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate.

Figure 4:
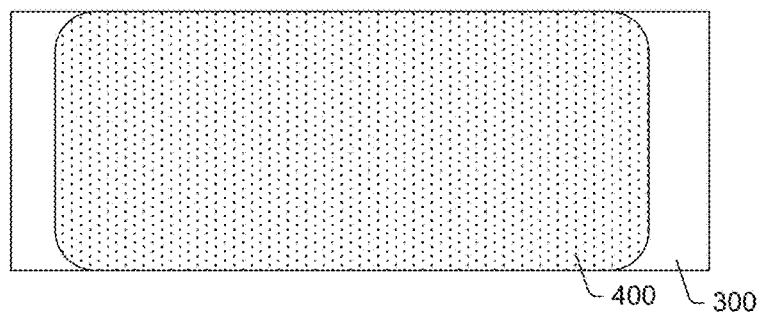

In FIG. 4 a highly doped, conductive region 400 is formed in the substrate 300. The conductive region 400 has a second doping type that is opposite the first doping type. For example, the highly doped conductive region can be an n-type region having a doping concentration ranging from about $1 \times 10^{19}$ cm$^{-3}$ to about $1 \times 10^{21}$ cm$^{-3}$. In some embodiments, the conductive region 400 is formed by providing a mask (not shown) over the substrate 300, and directing a beam of ions toward the masked substrate. The mask blocks ions or diffusion species from entering the substrate, whereas ions or diffusion species pass through an opening in the mask to form the conductive region. In other embodiments the conductive region can be formed using a POCL3 (phosphorous oxychloride) doping method or some other doping method, rather than ion implantation.

Figure 5A:
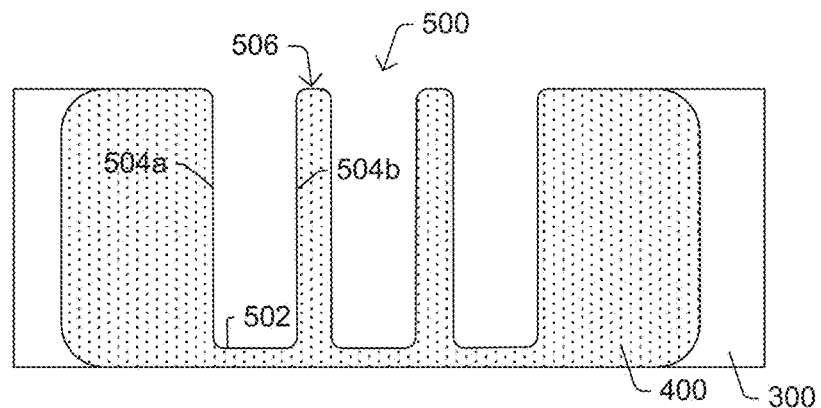

In FIG. 5A, a plurality of trenches 500 are formed in the conductive region 400. The trenches 500 have respective bottom portions 502 and respective sidewall surfaces 504a, 504b, and pillars or ridges 506 are arranged between neighboring trenches. The trenches 500 can each have a width-to-depth aspect ratio of approximately 1:20 in some embodiments. For example, a trench can be approximately 1.2 μm wide and approximately 22 μm deep in some embodiments. In other embodiments, the width to depth ratio can range from approximately 1000 (deep and narrow trenches) to approximately 1 (shallow and wide trenches), although deep and narrow trenches tend to provide denser capacitor layouts. The trenches 500 are formed by providing trench mask (not shown), and carrying out an etch (e.g., a plasma etch) with the trench mask in place. The trench mask can be a photoresist mask or hard mask, such as an oxide or a nitride mask for example, among others.

Figure 5B:
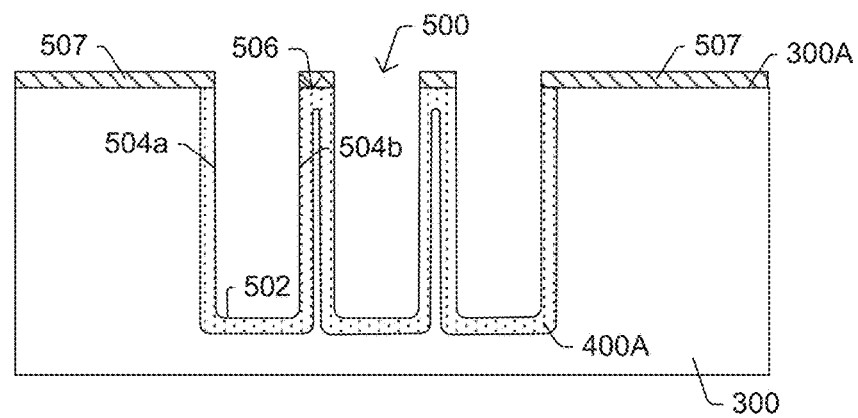

FIG. 5B shows an alternative processing embodiment consistent with the structural implementation previously illustrated in FIG. 1. This alternative process can be utilized when the trenches are more than a few microns deep, which makes formation of the conductive region by diffusion of doping species from the upper substrate surface as described in FIG. 5A impractical. Therefore, FIG. 5B's alternative process starts formation of a deep trench hard mask 507 over upper substrate surface 300A. With the deep trench hard mask 507 in place, an etch is carried out to form trenches 500. After the trenches 500 have been formed and with the deep trench hard mask 507 still in place, N-type doping species are diffused through the deep trench bottom 502 and deep trench sidewalls 504a, 504b using the remaining deep trench etch hard mask 507 as a doping mask. As depicted, the resulting conductive region 400A has a geometry that follows the contours of the trenches 500. FIG. 5B is a preferred embodiment for an IC that contains capacitors as well as other components, such as diodes, transistors, etc. on the same die. High dose of the N+ dopant can be introduced by a POCL3 process, an exposure to PH3 (phosphine) at high temperature, or other techniques. This process allows for formation of junction isolated capacitor structures where each plate of each capacitor can be biased individually. P+ dopants could also be used. For simplicity, the remaining cross-sections are depicted to be consistent with FIG. 5A, however, it will be appreciated that FIG. 5B's implementation could also be carried forward in a similar manner.

Figure 6:
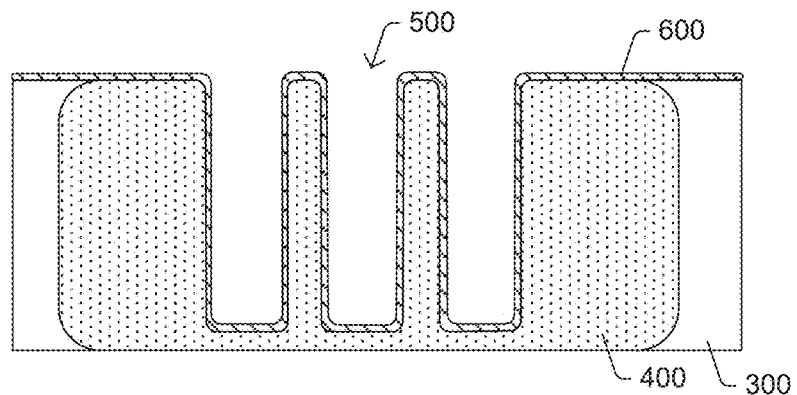

In FIG. 6, a first dielectric layer 600 is formed over the respective sidewalls and bottom portions of the trenches 500. In some embodiments, the dielectric layer 600 is formed directly and conformally over the sidewalls and bottom surfaces of the trenches 500, although other layers (e.g., liners) can also be arranged between dielectric layer 600 and the trench surfaces in other implementations. To form the first dielectric layer 600 within the trenches, a well known three step process can be used to achieve consistent conformal deposition over the workpiece features. In a first step, a thermal oxidation can be carried out to form a thin oxide layer. In second step, a low pressure chemical vapor deposition (CVD) is provided to form a nitride layer over the oxide layer. In a third step, another oxidation step is carried out, such that the first dielectric layer 600 can be an oxide-nitride-oxide (ONO) structure. In some embodiments the dielectric layer 600 can have a dielectric constant ranging between 3 and 1000, with some embodiments having a dielectric constant of approximately 20, although other values are also possible. Dielectrics such as metal oxides, or high K dielectrics can be used. Examples of these include $HfO_2$ (hafnium dioxide), $Al_2O_3$ (alumina), $ZrO_2$ (zirconium dioxide), $Ta_2O_5$ (tantalum pentoxide) and others.

Figure 7:
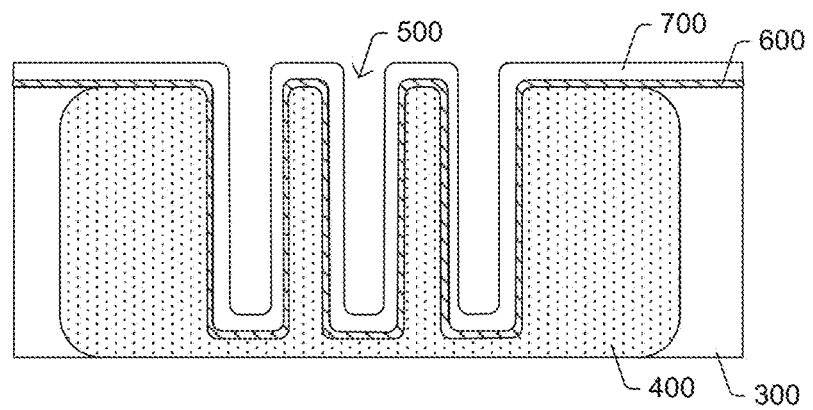

In FIG. 7, a first conductive layer 700, such as a poly1 layer is formed over the first dielectric layer 600. Often, the first conductive layer 700 is formed by in-situ doped low-pressure CVD. In other embodiments, the first conductive layer 700 can also be formed of conductive materials other than polysilicon, such as metal for example.

Figure 8:
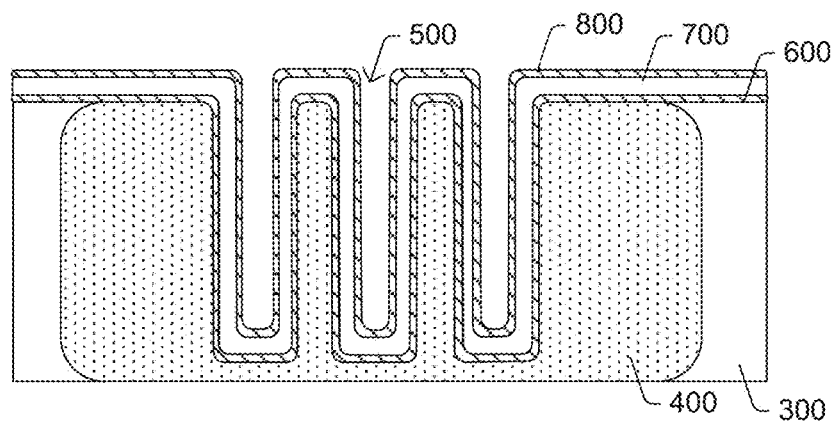

In FIG. 8, a second dielectric layer 800 is formed in the trenches 500 over the first conductive layer 700. In some embodiments, the second dielectric layer 800 is formed directly and conformally over inner sidewalls and bottom surfaces of the first conductive layer 700, although other layers (e.g., liners) can also be arranged between second dielectric layer 800 and first conductive layer 700 in other implementations. The second dielectric layer 800 may have a thickness of approximately 20 to 1000 Angstroms, and can be made of ONO in some embodiments and formed as described with respect to FIG. 6 above. In some embodiments the second dielectric layer 800 can have a dielectric constant ranging between 3 and 1000, with some embodiments having a dielectric constant of approximately 20, although other values are also possible.

Figure 9:
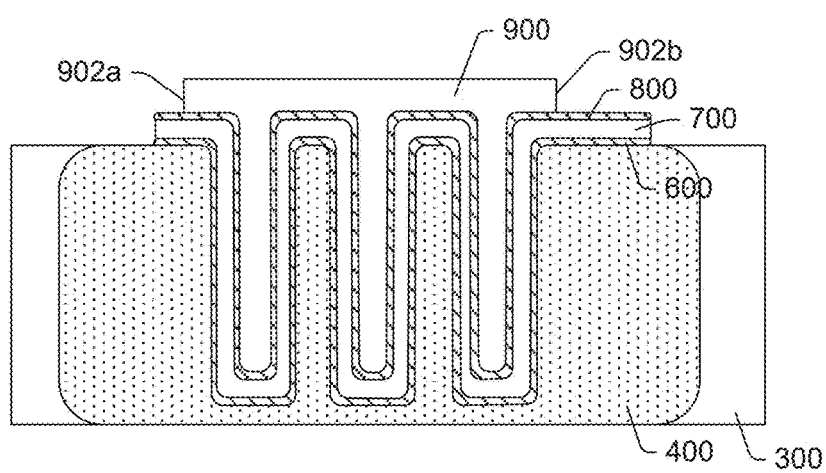

In FIG. 9, a second conductive layer 900, such as a poly2 layer is formed over the second dielectric layer 800. Often, the second conductive layer 900 is formed by in-situ doped low-pressure CVD. In other embodiments, the second conductive layer 900 can also be formed of conductive materials other than polysilicon, such as metal for example. When high aspect ratio trenches are used, gaps or voids may be present in the second conductive layer within the trenches. These gaps or voids are largely an artifact of the manufacturing process as a practical matter, although it may be possible to limit or eliminate them in some situations. After the second conductive layer 900 is formed, a photoresist mask (not shown) or other mask in formed, and an etch is carried out with the mask in place to form sidewalls 902a, 902b.

Figure 10:
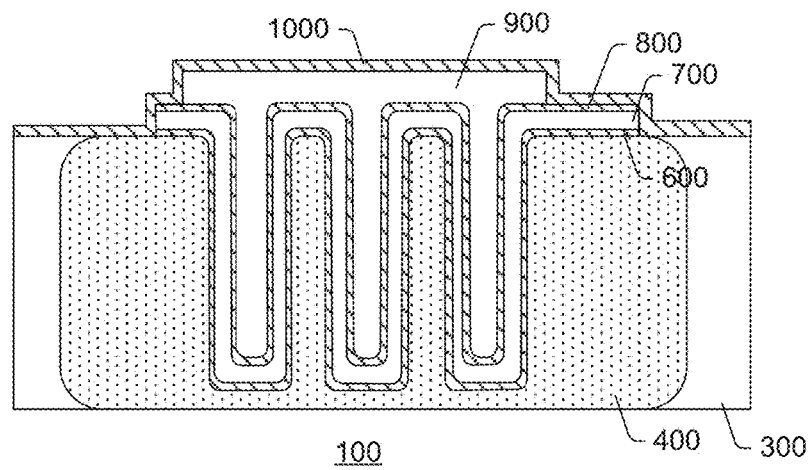

In FIG. 10, an inter-level dielectric (ILD) 1000 is formed over the workpiece. In some embodiments, the ILD 1000 has a thickness of approximately 1000 angstroms and a dielectric constant ranging from approximately 3.0 to approximately 8.5, although other thicknesses and dielectric constants could also be used.

Figure 11:
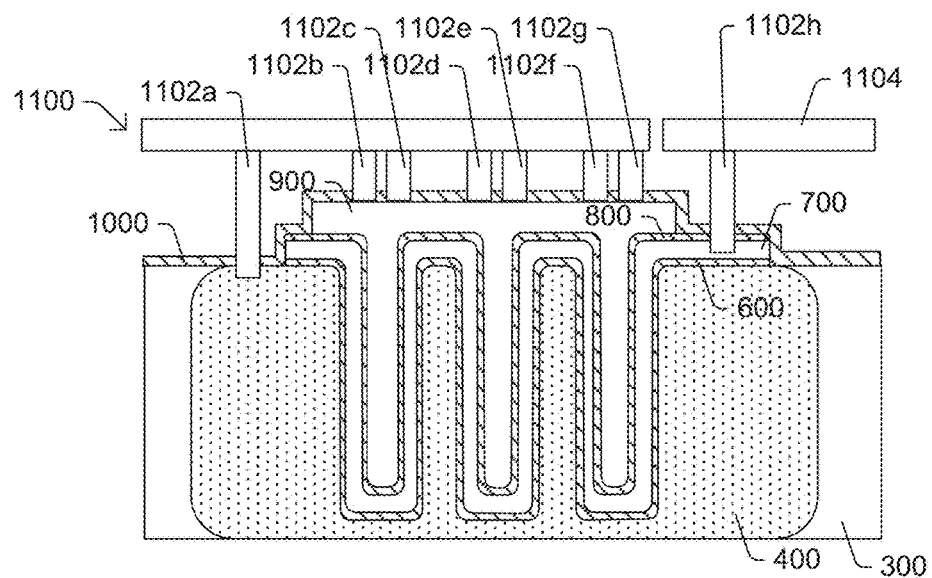

In FIG. 11, an interconnect structure 1100 is formed. The illustrated interconnect structure 1100 includes contacts (e.g., 1102a-1102h) and a metal1 layer 1104 that couple the conductive region 400 to the second conductive layer 1104 to form a high density capacitor that is made up of first and second stacked capacitors. Rather than the contacts and metal1 layer, other embodiments could include higher level metal layers (and addition to or in place of the illustrated layers) or conductive regions or layers in the semiconductor substrate to coupled conductive region 400 to the second conductive layer 1104.

Figure 12A:
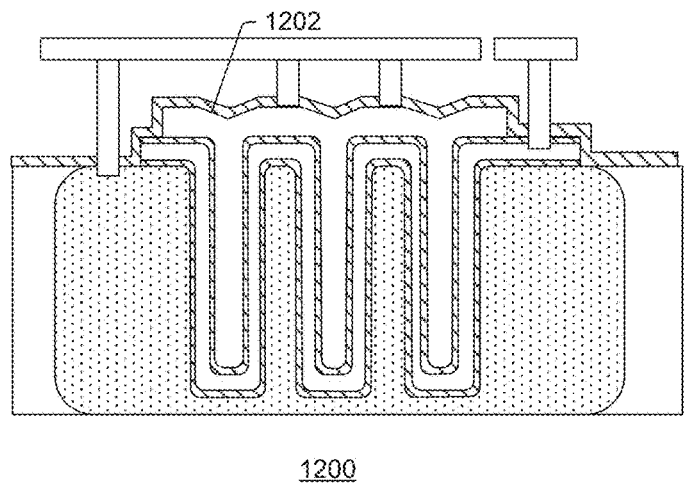
FIG. 12A shows a cross-sectional view illustrating some embodiments of a high density capacitor, which may save a chemical mechanical polishing operation relative to FIG. 1's embodiment.
Figure 12B:
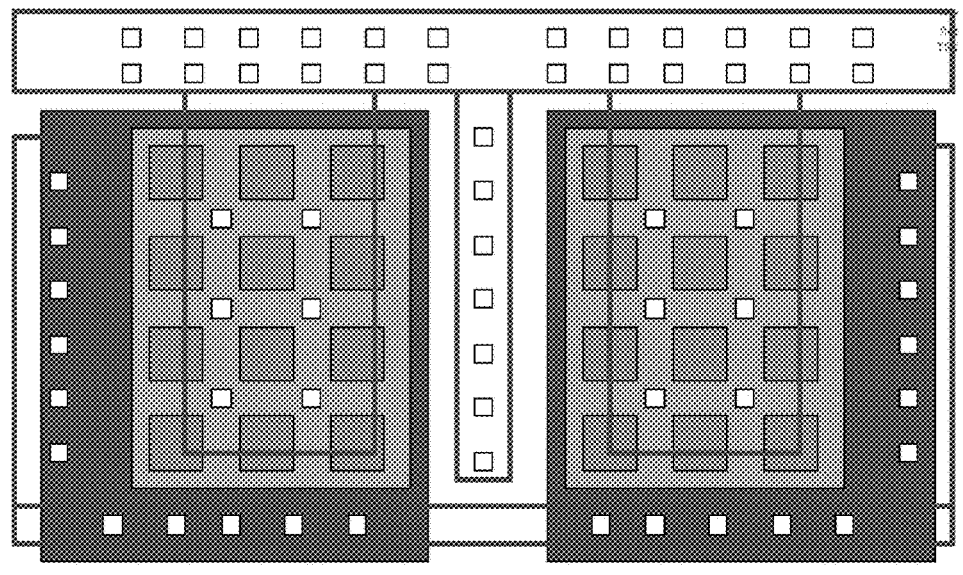
FIG. 12B shows a top view corresponding to FIG. 12A's high density capacitor.

FIG. 12 shows another embodiment of a high density capacitor 1200. The high density capacitor 1200 has many of the same structural features as previously discussed with regards to FIG. 1's capacitor 1000. However, unlike FIG. 1's capacitor where the second conductive layer had a planarized upper surface, FIG. 12's capacitor has an un-planarized upper surface 1202. Also, the contacts are positioned over the ridges or pillars between neighboring trenches in FIG. 12, whereas in FIG. 1 the contacts were positioned over the trenches.

Figure 13:
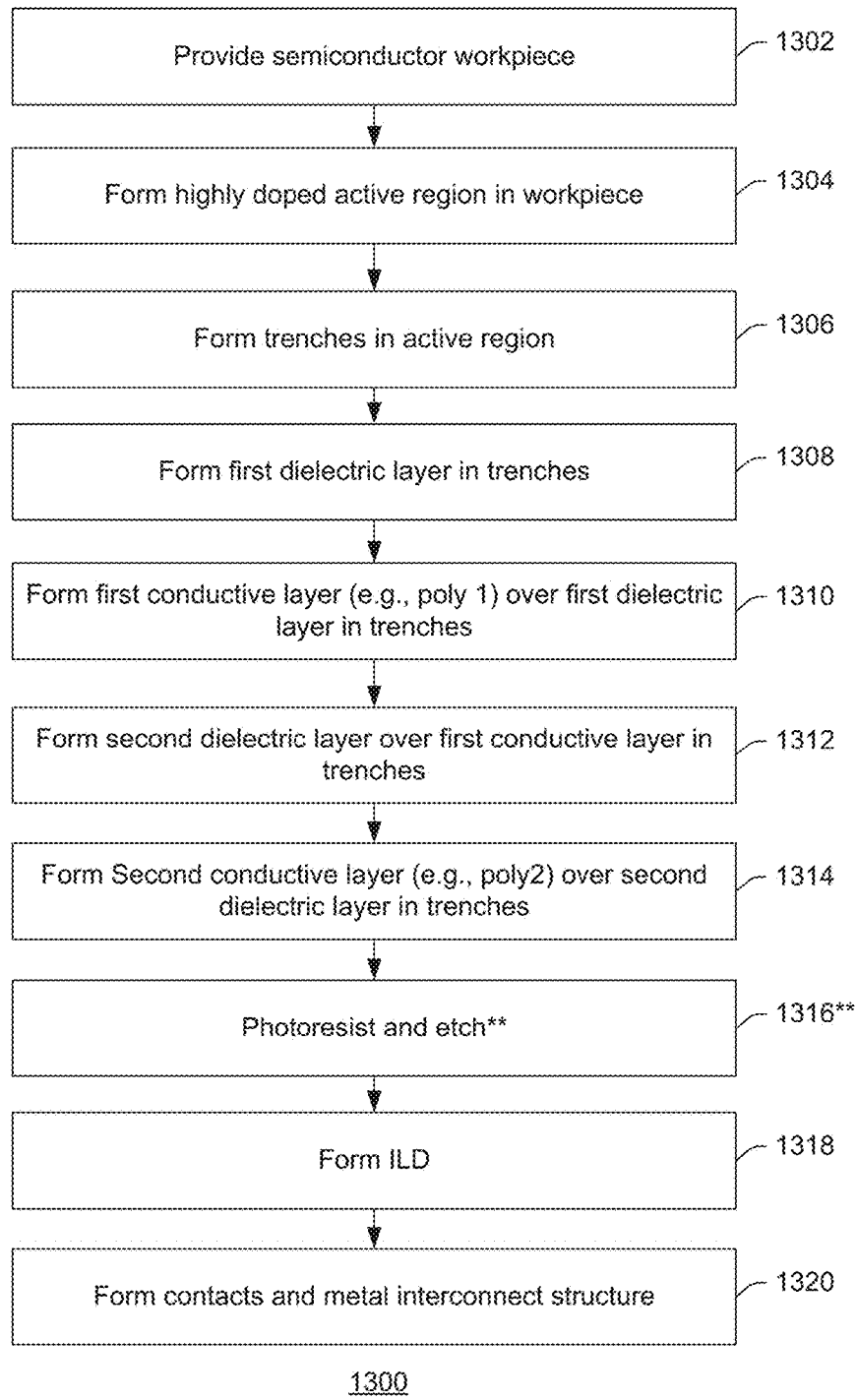
FIG. 13 is a flow-chart illustrating some embodiments of a methodology for manufacturing a high density capacitor.

FIG. 13 shows a method 1300 for manufacturing FIG. 12's capacitor 1200. As can be appreciated by comparing FIG. 13 with FIG. 2 methods (see e.g., block 1316 in FIG. 13 and compare with block 216 in FIG. 2), FIG. 13's manufacturing method eliminates a CMP operation and thereby streamlines manufacturing somewhat.

Figure 14A:
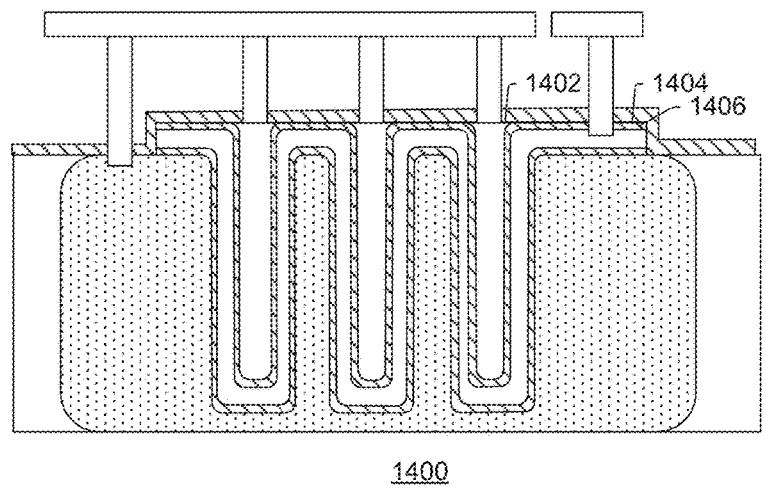
FIG. 14A shows a cross-sectional view illustrating some embodiments of a high density capacitor, which may save a mask operation relative to FIG. 1's embodiment.
Figure 14B:
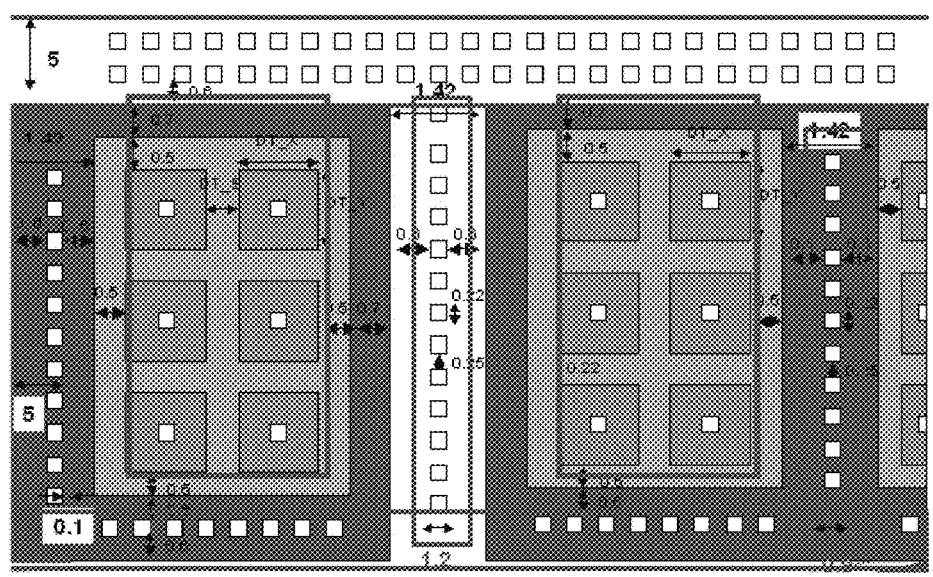
FIG. 14B shows a top view corresponding to FIG. 14A's high density capacitor.

FIG. 14 shows another embodiment of a high density capacitor 1400. The high density capacitor 1400 has many of the same structural features as previously discussed with regards to FIG. 1's capacitor 1000 and FIG. 12's capacitor 1200. However, unlike the previously described capacitors, a second conductive layer upper surface 1402 in FIG. 14's capacitor is planar with adjacent upper surfaces of the second dielectric (1404) or with upper surface of first conductive layer (1406). Contacts are then coupled to the planarized second conductive layer upper surface 1402.

Figure 15:
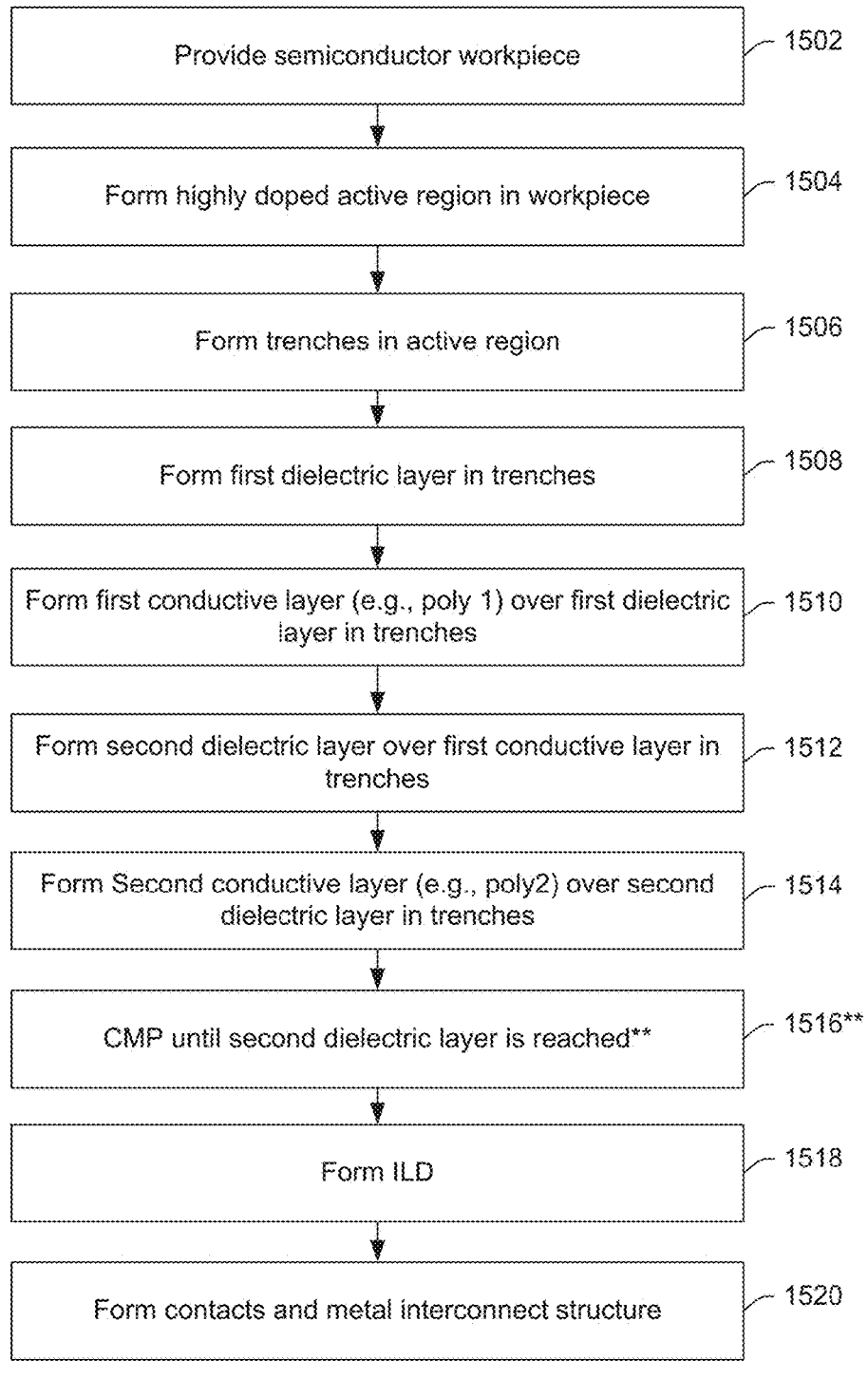
FIG. 15 is a flow-chart illustrating some embodiments of a methodology for manufacturing a high density capacitor.

FIG. 15 shows a method 1500 for manufacturing FIG. 14's capacitor 1400. As can be appreciated by comparing FIG. 15 with FIG. 2, for example, one can see that FIG. 15's manufacturing method eliminates a photolithography step relatively to previous methods (see e.g., block 1516 in FIG. 15 and compare with block 216 in FIG. 2). In eliminating this mask step, FIG. 15's method provides significant cost savings.

Figure 16A:
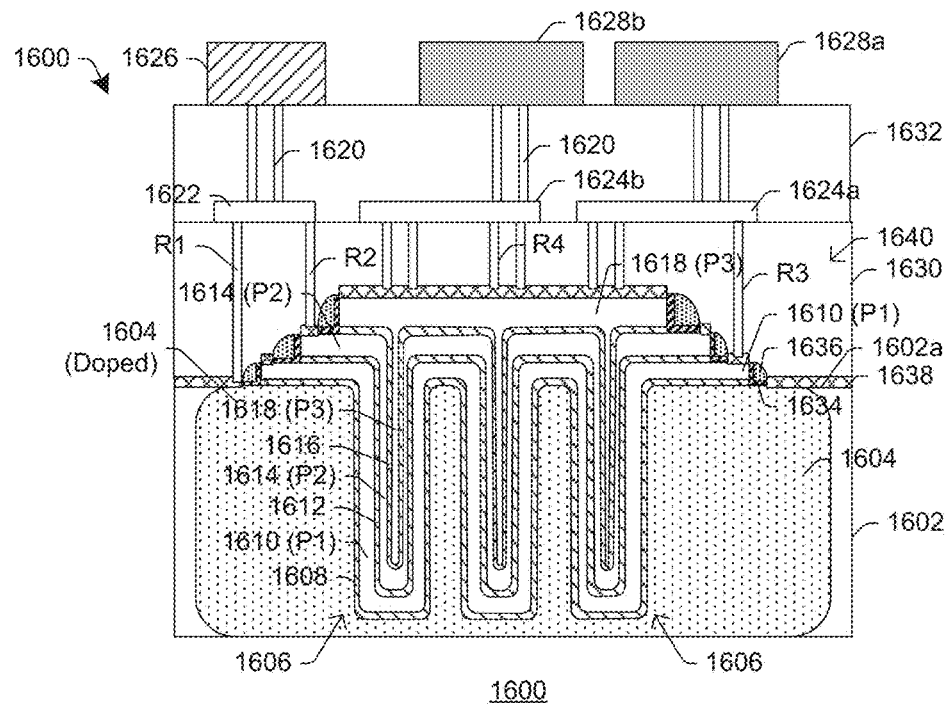
FIG. 16A shows a cross-sectional view of an integrated circuit (IC) comprising a high density capacitor in accordance with some embodiments.

FIG. 16A shows a cross-sectional view of an integrated circuit (IC) 1600 comprising a high density capacitor in accordance with some embodiments.

As shown in FIG. 16A, a plurality of trenches 1606 is disposed within a doped region 1604 of a semiconductor substrate 1602. The semiconductor substrate 1602 can be a silicon substrate having a first conductivity type (e.g., n−) and the doped region 1604 can be highly doped having a second conductivity type (e.g., p++). The plurality of trenches 1606 extends downwardly from the upper substrate surface 1602a into the doped region 1604. A first capacitor dielectric 1608 is disposed over an upper surface 1602a of the semiconductor substrate 1602 and extends downwardly along sidewall and bottom surfaces of the plurality of trenches 1606. A first conductive layer 1610 is disposed over the first capacitor dielectric 1608. A second capacitor dielectric 1612 is disposed in the trenches 1606 and over the first conductive layer 1610, and a second conductive layer 1614 is disposed in the trenches 1606 and over the second dielectric layer 1612. A third capacitor dielectric 1616 is arranged over the second conductive layer 1614 and a third conductive layer 1618 is arranged over the third capacitor dielectric 1616. Due to the high aspect ratio of the trenches 1606, the third conductive layer 1618 can include voids in the respective trenches 1606. In some embodiments, the first, second and third conductive layers 1610, 1614 and 1618 comprise polysilicon. In some embodiments, the first and second conductive layers 1610, 1614 are conformal and the third conductive layer 1618 fills an inner region of the trenches 1606 and may have a planar surface above the upper surface 1602a of the semiconductor substrate 1602. Notably, the number of conductive layers can be further increased according to different applications. For example, a fourth capacitor dielectric and a fourth conductive layer can be "stacked" over the third conductive layer to form a fourth trench capacitor in parallel with the illustrated three trench capacitors. In this scenario, the third conductive layer would be a conformal layer and the fourth conductive layer, the top conductive layer, would fill in the trench with a planar upper surface.

Figure 16B:
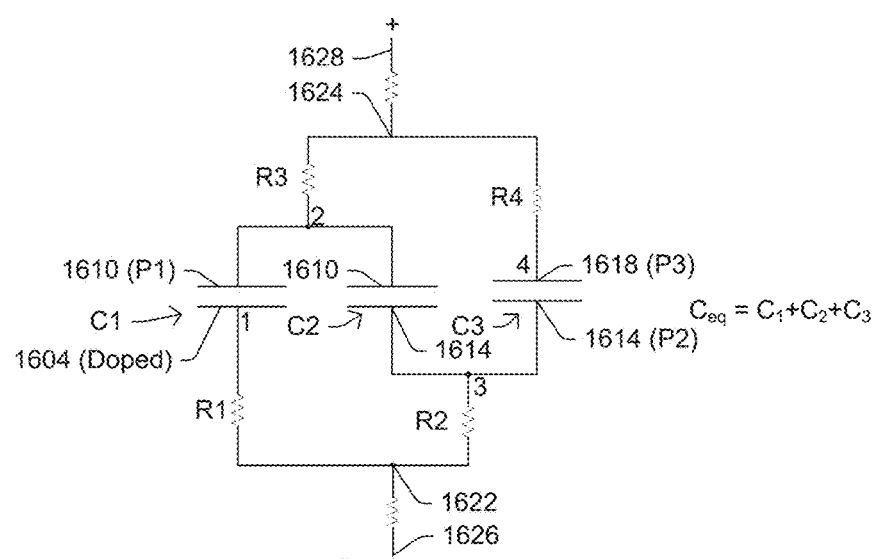
FIG. 16B shows an equivalent circuit of some embodiments for FIG. 16A's high density capacitors.

The high density capacitor of integrated circuit (IC) 1600 comprises multiple trench capacitors in parallel and vertically disposed over one another. FIG. 16B shows an equivalent circuit of some embodiments for FIG. 16A's high density capacitors. As shown in FIG. 16A and FIG. 16B, the high density capacitor comprises a first trench capacitor C1, a second trench capacitor C2 and a third trench capacitor C3 connected in parallel. The doped region 1604 acts as a first capacitor plate, and the first conductive layer 1610 (e.g., a first polysilicon layer) acts as a second capacitor plate of the first trench capacitor C1. The first and second capacitor plates are separated by the first capacitor dielectric 1608. Above the first capacitor C1, the second capacitor C2 comprises the second capacitor plate (the first conductive layer 1610) and a third capacitor plate (the second conductive layer 1614), which are separated by the second capacitor dielectric 1612. Above the second capacitor C2, the third capacitor C3 comprises the third capacitor plate (the second conductive layer 1614) and a fourth capacitor plate (the third conductive layer 1618), which are separated by the third capacitor dielectric 1616. Thus, the first capacitor C1 and the second capacitor C2 share the first conductive layer 1610 as a common capacitor plate and the second capacitor C2 and the third capacitor C3 share the second conductive layer 1614 as a common capacitor plate. For pairs of the first and second capacitors C1, C2 or the second and third capacitors C2, C3, the other respective capacitor plates are connected, i.e., the first capacitor plate of C1 (the doped region 1604) and the third capacitor plate (the second conductive layer 1614) of C2 are connected together, and the second capacitor plate of C2 (the first conductive layer 1610) and the fourth capacitor plate (the third conductive layer 1618) of C3 are connected together. The equivalent capacitance $C_{eq}$ is equal to a sum of the capacitance of the first, second and third trench capacitors C1, C2, and C3.

Referring back to FIG. 16A, an interconnect structure 1640 is disposed within a first inter-dielectric layer 1630 and a second inter-dielectric layer 1632 configured to connect the first, second and third trench capacitors C1, C2, and C3 in parallel. The interconnect structure 1640 comprises a first plurality of plugs R1 contacting a peripheral region of the doped region 1604 not covered by the first conductive layer 1610, a second plurality of plugs R2 contacting a peripheral region of the second conductive layer 1614, and a first group of horizontal metal lines 1622 respectively connecting some of the first and second pluralities of plugs R1, R2. The interconnect structure 1640 further comprises a third plurality of plugs R3 contacting a peripheral region of the first conductive layer 1610 not covered by the second conductive layer 1614, a fourth plurality of plugs R4 contacting the third conductive layer 1618, and a second group of horizontal metal lines 1624 (e.g. 1624a, 1624b) respectively connecting some of the third and fourth pluralities of plugs R3, R4.

In some embodiments, conformal dielectric liners (e.g. 1634) are disposed on the peripheral regions of the doped region 1604 and first and second conductive layers 1610, 1614 and along neighboring sidewalls of the first, second and third conductive layers 1610, 1614, 1618. Sidewall spacers (e.g. 1636) are disposed on the conformal dielectric liners. A silicide layer 1638 is disposed over exposed upper surfaces of the first, second and third conductive layers 1610, 1614 and 1618 and over the upper surface 1602a of the semiconductor substrate 1602, providing an ohmic contact between plugs and underlying conductive layers.

In some embodiments, a first group of multiple bonding pads 1626 are disposed on top of the integrated circuit 1600 respectively coupled to some of the first group of metal lines 1622. A second group of multiple bonding pads 1628 are disposed on top of the integrated circuit 1600 respectively coupled to some of the second group of metal lines 1624 through connecting vias 1620. In some embodiments, each bonding pad of the first group 1626 is connected to a respective pin of the IC 1600 and is configured to be connected to a power source, and each bonding pad of the second group 1628 is connected to a respective pin of the IC 1600 and is configured to be connected to a ground terminal.

FIG. 16C and FIG. 16D show top views of bonding pads for the high density capacitor of the IC 1600 in accordance with some embodiments. As shown in FIG. 16C and FIG. 16D, the first group of multiple bonding pads 1626 and the second group of multiple bonding pads 1628 can be arranged side by side or in a staggered form, such that capacitor plates (1604, 1610, 1614, 1618) are connected to the contacting pads (1626 or 1628) by more vertical wires, such as plugs R1, R2, R3, R4 and connecting vias 1620, in parallel, and shorter horizontal wires, such as metal lines 1622, 1624 (shown in FIG. 16A). In this way, impedance of the interconnection structure 1640 is reduced.

FIG. 16E further shows a top view of the high density capacitor of the IC 1600 in accordance with some embodiments. As shown by FIG. 16E, the trenches underlying the capacitor are arranged in an array of rows and columns within the doped region 1604 and the first, second, and third conductive layers 1610, 1614, and 1618 are disposed into the trenches with a step structure, such that the second conductive layer 1614 is recessed back from the first conductive layer 1610 and the third conductive layer 1618 is recessed back from the second conductive layer 1614. The plugs are arranged at exposed peripheral regions of the conductive layers and can be regionally connected by horizontal metal lines 1622, 1624. In some embodiments, the IC 1600 comprises two or more layers of metal lines disposed in stacked inter-dielectric layers. The first group of multiple bonding pads 1626 and the second group of multiple bonding pads 1628 are spread over the top of the IC 1600 for more flexible and low impedance connections.

FIGS. 17-24 show a series of cross-sectional views of some embodiments of a method for manufacturing a high density capacitor at various stages of manufacture. Although FIGS. 17-24 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 17:
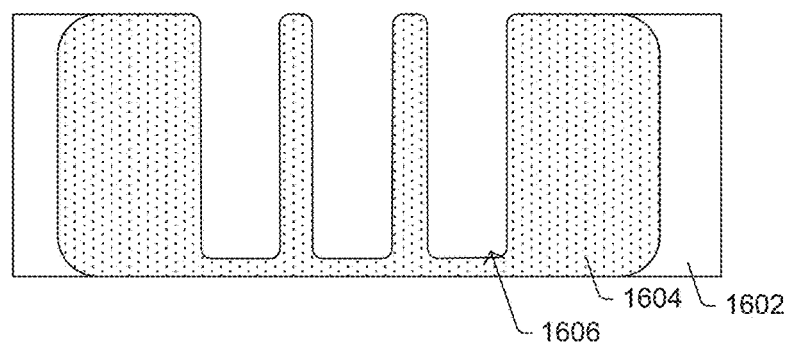
FIGS. 17-24 show a series of cross-sectional views of some embodiments of a method for manufacturing a high density capacitor at various stages of manufacture.

As shown in FIG. 17, a plurality of trenches 1606 is formed within a doped region 1604 from an upper surface of a semiconductor substrate 1602. In some embodiments, the substrate 1602 can be a bulk semiconductor wafer having a first conductivity type at a first doping concentration. For example, substrate can be a silicon wafer that is lightly doped with a p-type dopant, or can be lightly doped with a p-type dopant. The doped region 1604 has a second doping type that is opposite the first doping type. For example, the highly doped region 1604 can be an n-type region having a doping concentration ranging from about $1E19$ $cm^{-3}$ to about $1E21$ $cm^{-3}$. In some embodiments, the doped region 1604 is formed by providing a mask (not shown) over the substrate 1602, and directing a beam of ions toward the masked substrate. The mask blocks ions or diffusion species from entering the substrate 1602, whereas ions or diffusion species pass through an opening in the mask to form the doped region 1604. The plurality of trenches 1606 can each have a width-to-depth aspect ratio of approximately 1:20 in some embodiments. The trenches 1606 can be formed by providing trench mask (not shown), and carrying out an etch (e.g., a plasma etch) with the trench mask in place. The trench mask can be a photoresist mask or hard mask, such as an oxide or a nitride mask for example, among others.

Figure 18:
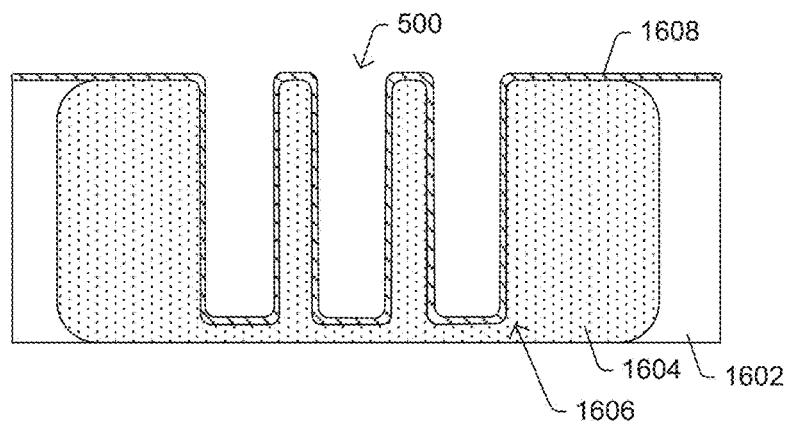
Figure 19:
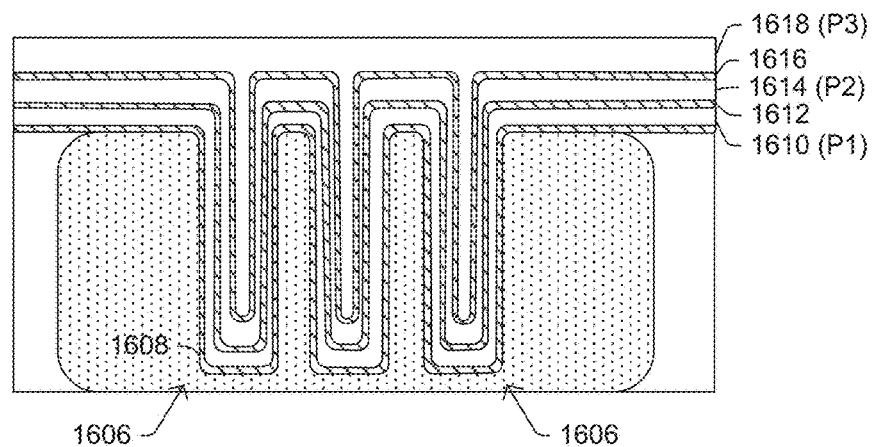

As shown in FIGS. 18-19, a plurality of trench capacitors are formed in the plurality of trenches 1606. The plurality of trench capacitors comprises alternate layers of a dielectric material and a conductive material conformally formed over one another. As shown in FIG. 18, a first capacitor dielectric 1608 is formed directly and conformally over the sidewalls and bottom surfaces of the trenches 1606, although other layers (e.g., liners) can also be arranged between the first capacitor dielectric 1608 and the trench surfaces in other implementations. In some embodiments, a three step process can be used to achieve consistent conformal deposition of an oxide-nitride-oxide (ONO) structure as the first capacitor dielectric 1608. As shown in FIG. 19, a first conductive layer 1610, such as a poly1 layer is formed over the first dielectric layer 1608. The first conductive layer 1610 can be formed by in-situ doped low-pressure CVD. In other embodiments, the first conductive layer 1610 can also be formed of conductive materials other than polysilicon, such as metal for example. Then, a second capacitor dielectric 1612, a second conductive layer 1614, a third capacitor dielectric 1616, and a third conductive layer 1618 can formed in the trenches 1606 in succession over the first conductive layer 1610.

Figure 20:
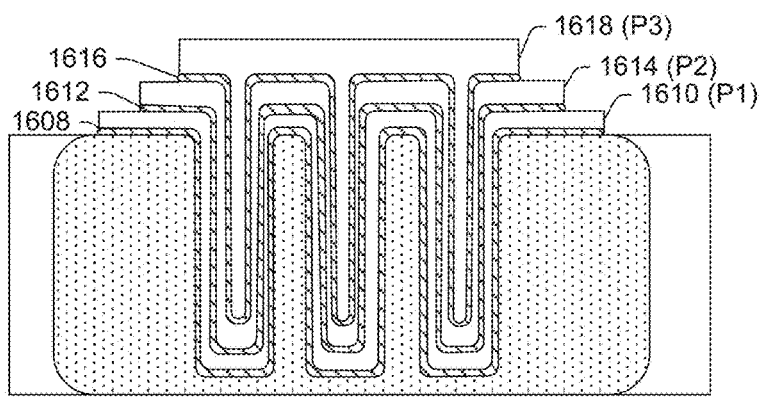

As shown in FIG. 20, a multi-step etch is performed to form a step structure above an upper surface of the semiconductor substrate 1602. As shown in FIG. 20, the first conductive layer 1610, the second conductive layer 1614, and the third conductive layer are in succession recessed one from another, exposing peripheral regions for later formed contacting structures.

Figure 21:
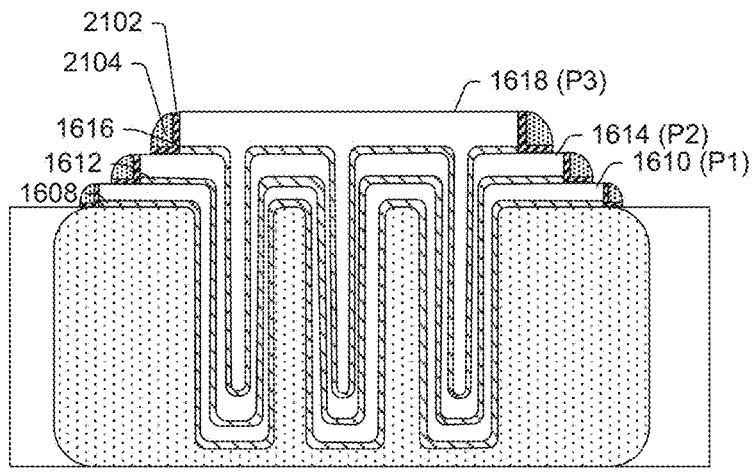

As shown in FIG. 21, dielectric liners 2102 and sidewall spacers 2104 are formed along outer sidewalls of the step structure at the first, second and third levels.

Figure 22:
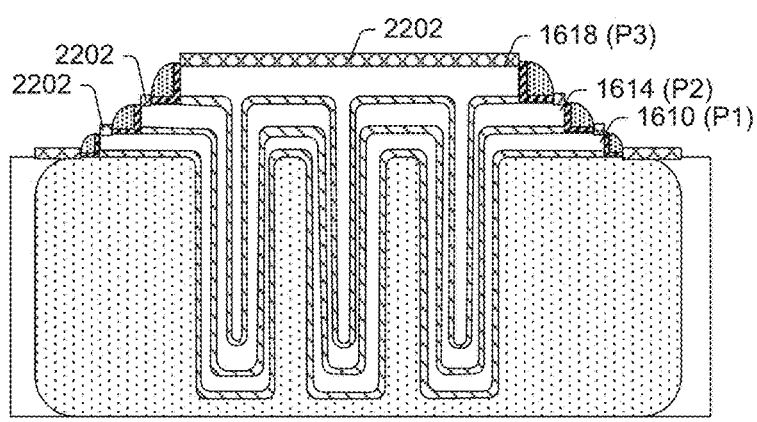

As shown in FIG. 22, a silicide layer 2202 is formed over exposed upper surfaces of the first, second and third conductive layers 1610, 1614, 1618 and over the upper surface of the semiconductor substrate.

Figure 23:
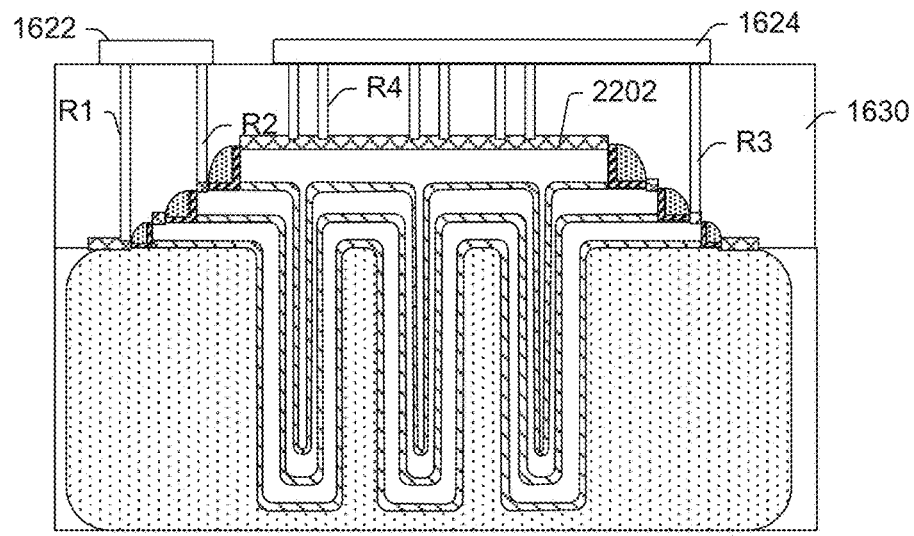

As shown in FIG. 23, a first group of horizontal metal lines 1622 is formed over a first ILD layer 1630, respectively connecting some plugs R1, R2, contacting the silicide layer over the semiconductor substrate 1602 and the second conductive layer 1614. A second group of horizontal metal lines 1624 is formed over the first ILD layer 1630, respectively connecting some plugs R3, R4, contacting the silicide layer over the first conductive layer 1610 and the third conductive layer 1618.

Figure 24:
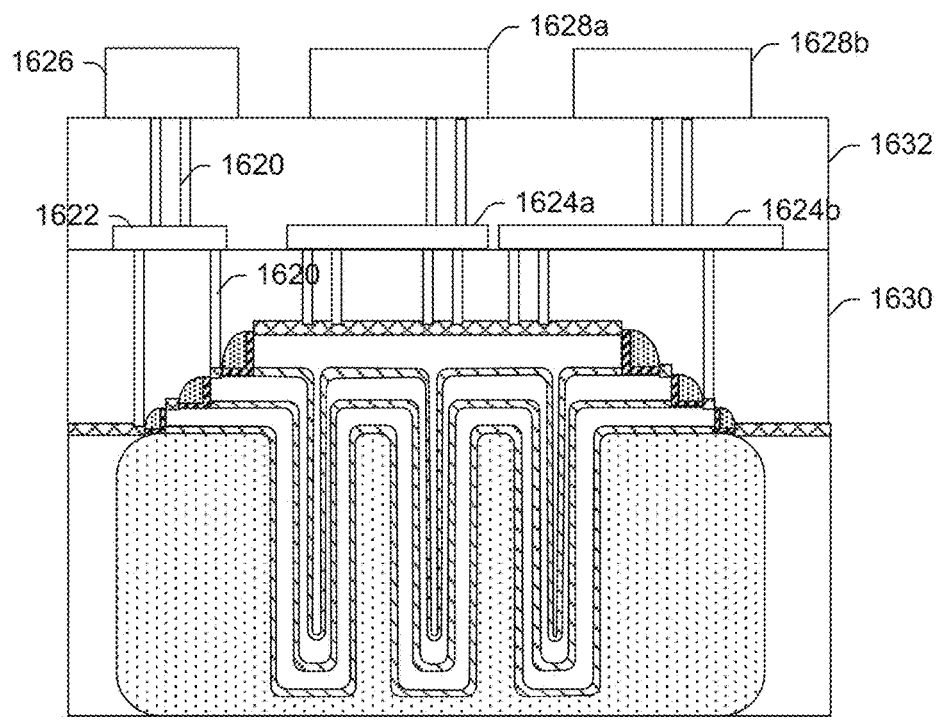

As shown in FIG. 24, a first group of bonding pads 1626 is formed over a second ILD layer 1632, respectively connecting some of the first group of horizontal metal lines 1622. A second group of bonding pads is formed over the second ILD layer 1632, respectively connecting some of the second group of horizontal metal lines 1624.

Figure 25:
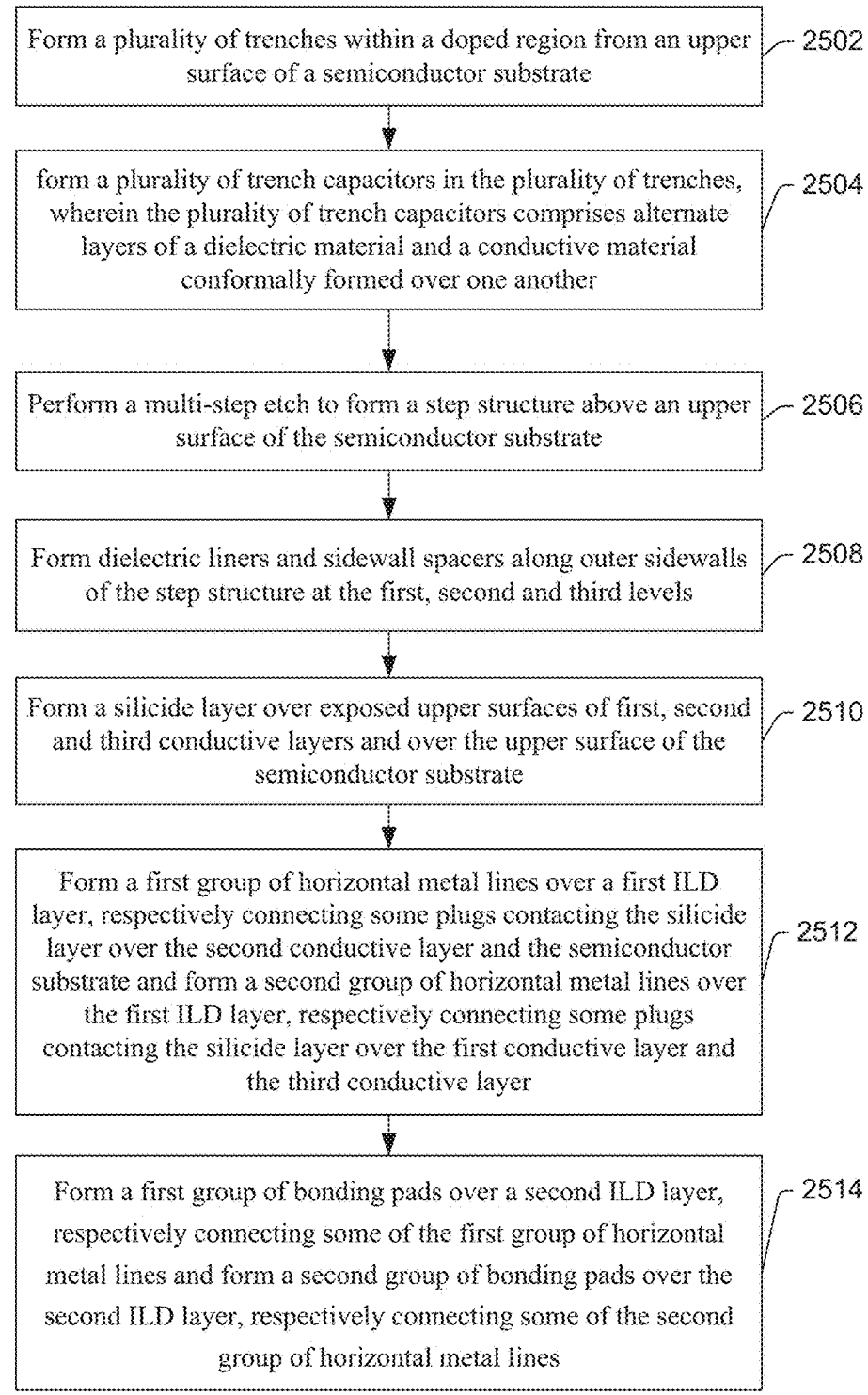
FIG. 25 shows a flow diagram of some embodiments of a method for manufacturing a high density capacitor.

FIG. 25 shows a flow diagram of some embodiments of a method for manufacturing a high density capacitor.

At act 2502, a plurality of trenches is formed within a doped region from an upper surface of a semiconductor substrate.

At act 2504, a plurality of trench capacitors are formed in the plurality of trenches. The plurality of trench capacitors comprises alternate layers of a dielectric material and a conductive material conformally formed over one another.

At act 2506, a multi-step etch is performed to form a step structure above an upper surface of the semiconductor substrate.

At act 2508, dielectric liners and sidewall spacers are formed along outer sidewalls of the step structure at the first, second and third levels.

At act 2510, a silicide layer is formed over exposed upper surfaces of the first, second and third conductive layers and over the upper surface of the semiconductor substrate.

At act 2512, a first group of horizontal metal lines is formed over a first ILD layer, respectively connecting some plugs that contact the silicide layer over the semiconductor substrate and the second conductive layer. A second group of horizontal metal lines is formed over the first ILD layer, respectively connecting some plugs that contact the silicide layer over the first conductive layer and the third conductive layer.

At act 2514, a first group of bonding pads is formed over a second ILD layer, respectively connecting some of the first group of horizontal metal lines. A second group of bonding pads is formed over the second ILD layer, respectively connecting some of the second group of horizontal metal lines.

Therefore, it will be appreciated that some embodiments relate to an integrated circuit (IC). The IC includes a first trench capacitor, a second trench capacitor and an interconnect structure. The first trench capacitor comprises a first capacitor plate disposed in a plurality of trenches in a semiconductor substrate, and a second capacitor plate disposed in the plurality of trenches and separated from the first capacitor plate by a first dielectric along bottom and sidewall surfaces of the plurality of trenches. The second trench capacitor is disposed over the first trench capacitor. The second trench capacitor comprises the second capacitor plate, and a third capacitor plate disposed in the plurality of trenches and separated from the second capacitor plate by a second capacitor dielectric. The interconnect structure connects the first capacitor plate and the third capacitor plate such that the first and second trench capacitors are in parallel.

Other embodiments relate to an integrated circuit (IC). The IC comprises a plurality of trenches disposed within a doped region from an upper surface of a semiconductor substrate and a first capacitor dielectric disposed over the upper surface of the semiconductor substrate and extending downwardly along sidewall and bottom surfaces of the plurality of trenches. The IC further comprises a first conductive layer disposed over the first capacitor dielectric and recessed back from a peripheral region of the doped region and a second capacitor dielectric disposed over the first conductive layer. The IC further comprises a second conductive layer disposed over the second capacitor dielectric and recessed back from a peripheral region of the first conductive layer and a third capacitor dielectric arranged over the second conductive layer. The IC further comprises a third conductive layer arranged over the third capacitor dielectric and recessed back from a peripheral region of the second conductive layer and an interconnect structure. The interconnect structure comprises a first plurality of plugs contacting the peripheral region of the doped region, a second plurality of plugs contacting the peripheral region of the second conductive layer, and a first group of horizontal metal lines respectively connecting some of the first and second pluralities of plugs. The interconnect structure also comprises a third plurality of plugs contacting the peripheral region of the first conductive layer, a fourth plurality of plugs contacting the peripheral region of the third conductive layer, and a second group of horizontal metal lines respectively connecting some of the third and fourth plurality of plugs.

Still other embodiments relate to a method of forming deep trench capacitors. The method comprises forming a plurality of trenches within a doped region from an upper surface of a semiconductor substrate and forming a plurality of trench capacitors in the plurality of trenches. The plurality of trench capacitors comprises alternate layers of a dielectric material and a conductive material conformally formed over one another. The method further comprises forming interconnect structures over the trench capacitors to connect the trench capacitors in parallel.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit (IC), comprising:
    a plurality of trenches disposed in a semiconductor substrate;
    a first trench capacitor comprising:
        a first capacitor plate disposed in the plurality of trenches, and
        a second capacitor plate disposed in the plurality of trenches and separated from the first capacitor plate by a first capacitor dielectric,
        wherein the first capacitor dielectric is disposed along a bottom surface and sidewall surfaces of each of the plurality of trenches;
    a second trench capacitor disposed over the first trench capacitor, the second trench capacitor comprising:
        the second capacitor plate, and
        a third capacitor plate disposed in the plurality of trenches and separated from the second capacitor plate by a second capacitor dielectric; and
    an interconnect structure connecting the first capacitor plate and the third capacitor plate such that the first trench capacitor and the second trench capacitor are in parallel.

2. The IC of claim 1, wherein the interconnect structure comprises:
    a first plug contacting the first capacitor plate;
    a second plug contacting the third capacitor plate; and
    a first horizontal metal line directly connecting the first plug and the second plug.

3. The IC of claim 2, further comprising:
    a third trench capacitor disposed over the second trench capacitor, the third trench capacitor sharing the third capacitor plate with the second trench capacitor and further comprising a fourth capacitor plate separated from the third capacitor plate by a third capacitor dielectric; and
    wherein the interconnect structure connects the second capacitor plate and the fourth capacitor plate;
    wherein the fourth capacitor plate fills in the plurality of trenches and has a planar upper surface.

4. The IC of claim 3, wherein the interconnect structure comprises:
    a third plug disposed through a first inter-dielectric layer contacting the second capacitor plate at a peripheral region, the peripheral region of the second capacitor plate laterally extending across a boundary of the third capacitor plate;
    a fourth plug disposed through the first inter-dielectric layer and contacting the fourth capacitor plate; and
    a second horizontal metal line disposed on the first inter-dielectric layer and directly connecting the third plug and the fourth plug.

5. The IC of claim 4, further comprising:
a first bonding pad disposed on a top surface of the interconnect structure and coupled to the first horizontal metal line; and
a second bonding pad disposed on the top surface of the interconnect structure and coupled to the second horizontal metal line.

6. The IC of claim 3, wherein the third capacitor plate fills in the plurality of trenches and extends upwardly over an upper surface of the semiconductor substrate.

7. The IC of claim 3, wherein the second capacitor plate and the third capacitor plate each comprise a polysilicon layer.

8. The IC of claim 3, wherein the first capacitor plate is a doped region surrounding the plurality of trenches having a first doping type at a first doping concentration, and the substrate has a second, opposite doping type at a second doping concentration that is less than the first doping concentration.

9. The IC of claim 1, wherein the first capacitor plate is a doped region surrounding the plurality of trenches;
wherein the second capacitor plate is a conductive layer disposed along the bottom surface and the sidewall surfaces of each of the plurality of trenches;
wherein the third capacitor plate is disposed along the bottom surface and the sidewall surfaces of each of the plurality of trenches.

10. An integrated circuit (IC), comprising:
a plurality of trenches disposed within a doped region and from an upper surface of a semiconductor substrate;
a first capacitor dielectric disposed over the upper surface of the semiconductor substrate and extending downwardly along sidewall surfaces and a bottom surface of each of the plurality of trenches;
a first conductive layer disposed over the first capacitor dielectric and recessed back from a peripheral region of the doped region;
a second capacitor dielectric disposed over the first conductive layer;
a second conductive layer disposed over the second capacitor dielectric and recessed back from a peripheral region of the first conductive layer;
a third capacitor dielectric arranged over the second conductive layer;
a third conductive layer arranged over the third capacitor dielectric and recessed back from a peripheral region of the second conductive layer; and
an interconnect structure comprising:
a first plug contacting the peripheral region of the doped region, a second plug contacting the peripheral region of the second conductive layer, and a first horizontal metal line connecting the first plug and the second plug; and
a third plug contacting the peripheral region of the first conductive layer, a fourth plug contacting the peripheral region of the third conductive layer, and a second horizontal metal line connecting the third plug and the fourth plug.

11. The IC of claim 10, wherein the doped region has a first doping type at a first doping concentration, and the semiconductor substrate has a second, opposite doping type at a second doping concentration that is less than the first doping concentration.

12. The IC of claim 10, wherein the first conductive layer, the second conductive layer, and the third conductive layer each are made of polysilicon.

13. The IC of claim 10, further comprising: a dielectric liner disposed on the peripheral region of each of the doped region, the first conductive layer, and the second conductive layer, and disposed along neighboring sidewalls of each of the first conductive layer, the second conductive layer, and the third conductive layer; and
a sidewall spacer disposed on the dielectric liner.

14. The IC of claim 10, further comprising:
a first bonding pad disposed on an uppermost dielectric layer and coupled to the first horizontal metal line through connecting vias disposed within the uppermost dielectric layer; and
a second bonding pad disposed on the uppermost dielectric layer and coupled to the second horizontal metal line through other connecting vias disposed within the uppermost dielectric layer.

15. The IC of claim 14, wherein the first bonding pad is connected to a pin of the IC and is configured to be connected to a power source, and the second bonding pad is connected to another pin of the IC and is configured to be connected to a ground terminal.

16. An integrated circuit (IC), comprising:
a plurality of trenches disposed within a doped region and extending downward from an upper surface of a semiconductor substrate;
a plurality of trench capacitors disposed in each of the plurality of trenches, wherein the plurality of trench capacitors comprises alternate layers of a dielectric material and a conductive material formed over one another; and
an interconnect structure disposed over the plurality of trench capacitors to connect the plurality of trench capacitors in parallel.

17. The IC of claim 16, wherein the plurality of trench capacitors comprise:
a first capacitor dielectric layer disposed in each of the plurality of trenches, the first capacitor dielectric layer extending along a bottom surface and sidewall surfaces of each of the plurality of trenches and over the upper surface of the semiconductor substrate;
a first conductive layer disposed over the first capacitor dielectric layer;
a second capacitor dielectric layer disposed over the first conductive layer;
a second conductive layer disposed over the second capacitor dielectric layer;
a third capacitor dielectric layer disposed over the second conductive layer; and
a third conductive layer disposed over the third capacitor dielectric layer, wherein the third conductive layer is filled in each of the plurality of trenches.

18. The IC of claim 17, wherein a sidewall of the first capacitor dielectric layer and a sidewall of the first conductive layer are vertically aligned at a first position, a sidewall of the second capacitor dielectric layer and a sidewall of the second conductive layer are vertically aligned at a second position recessed back relative to the first position, and a sidewall of the third capacitor dielectric layer and a sidewall of the third conductive layer are vertically aligned at a third position recessed back relative to the second position;
wherein a dielectric liner and a sidewall spacer are disposed along the sidewall of each of the first capacitor dielectric layer, the second capacitor dielectric layer, the third capacitor dielectric layer, the first conductive layer, the second conductive layer, and the third conductive layer;

wherein a silicide layer is disposed over an exposed upper surface of each of the first conductive layer, the second conductive layer, and the third conductive layer, and over the upper surface of the semiconductor substrate; and wherein a first inter-layer dielectric (ILD) layer is disposed over the silicide layer and an upper region of the sidewall spacer.

19. The IC of claim 18, further comprising:

a first plug and a second plug disposed through the first ILD layer, the first plug contacting the silicide layer over the second conductive layer, and the second plug contacting the silicide layer over the first conductive layer;

a first horizontal metal line disposed over the first ILD layer and connecting the first plug and the doped region; and a second horizontal metal line disposed over the first ILD layer and connecting the second plug and the third conductive layer.

20. The IC of claim 19, further comprising:

a second inter-layer dielectric (ILD) layer disposed over the first horizontal metal line, the second horizontal metal line, and the first ILD layer; and connecting vias disposed through the second ILD layer, contacting the first horizontal metal line and the second horizontal metal line.

* * * * *